US009047933B2

(12) United States Patent
Pan et al.

(10) Patent No.: US 9,047,933 B2
(45) Date of Patent: Jun. 2, 2015

(54) HIGH SPEED SIGNALING TECHNIQUES TO IMPROVE PERFORMANCE OF INTEGRATED CIRCUITS

(71) Applicant: SanDisk Technologies Inc., Plano, TX (US)

(72) Inventors: Feng Pan, Fremont, CA (US); Shankar Guhados, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 227 days.

(21) Appl. No.: 13/867,259

(22) Filed: Apr. 22, 2013

(65) Prior Publication Data

US 2014/0313836 A1 Oct. 23, 2014

(51) Int. Cl.
G11C 5/14 (2006.01)
(52) U.S. Cl.
CPC ........................................ *G11C 5/148* (2013.01)
(58) Field of Classification Search
USPC .................. 365/226, 227, 189.09, 185.17
See application file for complete search history.

(56) References Cited

U.S. PATENT DOCUMENTS

| 7,450,448 | B2 * | 11/2008 | Do ................................ 365/196 |
| 2007/0279031 | A1 * | 12/2007 | Takeyama ..................... 323/314 |
| 2011/0134703 | A1 | 6/2011 | Li et al. |
| 2011/0299314 | A1 | 12/2011 | Samachisa et al. |
| 2011/0299340 | A1 | 12/2011 | Samachisa et al. |
| 2012/0026791 | A1 | 2/2012 | Li |

OTHER PUBLICATIONS

U.S. Appl. No. 13/570,826 entitled Charge Cycling by Equalizing the Source and Bit Line Levels Between Pulses During No-Verify Write Operations for NAND Flash Memory, filed Aug. 9, 2012, 44 pages.
U.S. Appl. No. 13/628,465 entitled "Charge Pump Based Over-Sampling ADC for Current Detection," filed Sep. 27, 2012, 76 pages.
U.S. Appl. No. 13/827,609 entitled "Data Search Using Bloom Filters and NAND Based Content Addressable Memory," filed Mar. 14, 2013, 76 pages.
U.S. Appl. No. 13/835,032 entitled "3D Memory with Vertical Bit Lines and Staircase Word Lines and Vertical Switches and Methods Thereof," filed Mar. 15, 2013, 98 pages.
U.S. Appl. No. 13/838,782 entitled "3D Memory Having Vertical Switches with Surround Gates and Method Thereof," filed Mar. 15, 2013, 95 pages.
U.S. Appl. No. 13/840,201 entitled "Method for Forming Staircase Word Lines in a 3D Non-Volatile Memory Having Vertical Bit Lines," filed Mar. 15, 2013, 108 pages.
U.S. Appl. No. 13/794,344 entitled "Non-Volatile Memory Having 3D Array Architecture with Bit Line Voltage Control and Methods Thereof," filed Mar. 11, 2013, 54 pages.

* cited by examiner

*Primary Examiner* — Han Yang
(74) *Attorney, Agent, or Firm* — Davis Wright Tremaine LLP

(57) ABSTRACT

Techniques are presented to improve the performance, accuracy and power consumption of on-chip voltage biasing and transmission for highly loaded RC networks (such as wordlines or bitlines in NAND or 3D memory arrays) that are otherwise limited by the physics of RC time constant. When transitioning the near-end voltage of the network, an under-drive or over-drive level is applied, combined with feedback control to estimate when the far-end voltage approaches the desired level.

27 Claims, 7 Drawing Sheets

HIGH SPEED SIGNALING TECHNIQUES TO IMPROVE PERFORMANCE OF INTEGRATED CIRCUITS

FIELD OF THE INVENTION

This invention pertains generally to driver circuitry for supplying voltage levels to elements of integrated circuits, more particularly, to improving the speed of transition between different voltage levels.

BACKGROUND

RC delay during charging and discharging is always dominant issue in signal propagation delay when driving large integrated circuits, such as for memory arrays of NAND, BICS or 3D type. Although the voltage transition can be applied to the circuit as an ideal step response, at the far end of the circuit the response will be dependent upon the time constant $\tau=RC$ of the circuit elements being driven. To reach within 99% of the final target level takes at least 4.6 $\tau$. If RC time constant is large due to the R and C values of the driven component, then delay cannot be avoided. As the size and complexity of memory arrays and other circuit components continue to expand, there is a need for methods to improve such transition times in order to improve performance.

SUMMARY OF THE INVENTION

A first set of general aspects concern a circuit to supply voltage levels to a load circuit. The circuit includes driver circuitry connectable to supply at least a first voltage level and a second voltage level to the load circuit and a first switch through which the driver circuitry is connectable to the load circuit. A second switch is connected between a third voltage level and a first node between the first switch and the load circuit, wherein the second voltage level is intermediate to the first and third voltage levels. A resistance is connected in series with the second switch between the third voltage level and the first node. Control circuitry is connectable to control the first and second switches and includes a feedback circuit having a comparator having a first input connected to a second node between the first switch and the load circuit and a second input connected a reference voltage level. When the driver circuitry changes from supplying the first level to the second level, the control circuitry initially opens the first switch and closes the second switch and, based on the output of the comparator, subsequently closes the first switch and opens the second switch.

Other aspects relate to a method of supplying a load. The method includes supplying the load at an input node at a first voltage from a driver circuit and subsequently supplying the load at the input node at a second voltage level from the driver circuit. Subsequent to supplying the load at the first voltage and prior to supplying the load at the second voltage, the method includes performing a transition process. The transition process includes: disconnecting the input node from the driver circuit and connecting the input node to a third voltage level through a first resistance, wherein the second voltage level is intermediate to the first and third voltage level; with the input node disconnected from the driver circuit and connected to the third voltage level through the first resistance, monitoring the voltage level on the input node; and, in response to determining the voltage level on the input node reaching a reference value, disconnecting the input node from the third voltage level and connecting the input node to the driver circuit to be supplied at the second voltage.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following looks at techniques for improving high speed, on-chip changes in voltage biasing or transmission. Under-drive or over-drive techniques are known in the communication industry to shorten transition delay; however it is difficult to properly estimate the timing needed to signal when to stop the over- or under-drive level. The techniques presented bring a new approach to properly estimating the time needed to significantly and accurately improve the performance in delay while not wasting power by introducing over-/ under-drive with accurate feedback control.

Considering the problem more generally, techniques are presented to improve the performance, accuracy and power consumption of on-chip voltage biasing and transmission for highly loaded RC networks that are otherwise limited by the physics of RC time constant. This can be applied to any mixed signal design for driving an RC network with a relatively large time constant, but the primary examples considered here will be in the context of NAND memory for word line and bit line bias and settling speed and 3D-type memory (such as ReRAM or BiCS) with large mesh RC networks. More specifically, these techniques can be applied to bias voltage settling times, word line biasing (both for discharge and charge), and bit line biasing (for discharge and charge). More detail on NAND memories can be found in the following patent publication numbers and application numbers: US-2012-0026791; US-2011-0134703-A1; Ser. Nos. 13/570,826; 13/628,465; and 13/827,609. More information on 3D structures described in the following patent publication numbers and application numbers: US-2011-0299340-A1; US-2011-0299314-A1; Ser. Nos. 13/835,032; 13/838,782; 13/840,201; and 13/794,344.

Figure 1:
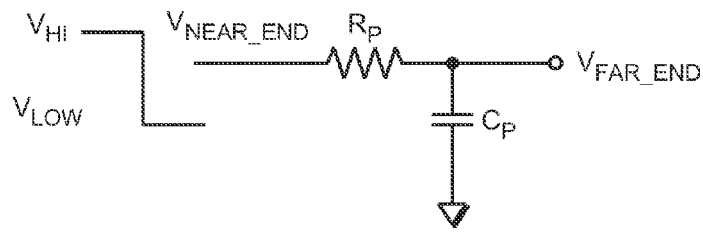
FIG. 1 illustrates an example of a simple RC network, or an RC network that has been lumped into a simple RC model.
Figure 2:
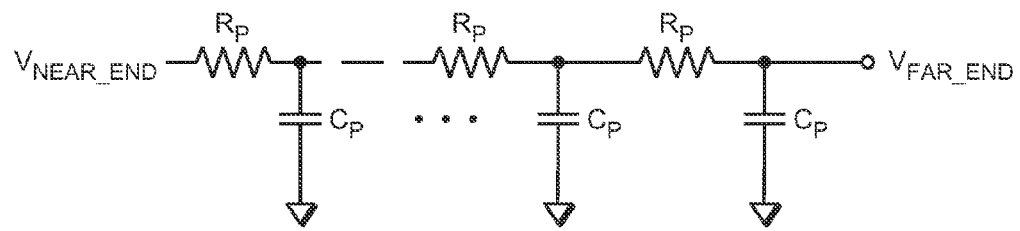
FIG. 2 illustrates an example of a distributed RC model.

On chip routing is a mesh network of resistances and capacitances of various combinations that can be placed into one of following categories: Simple RC networks, such as illustrated in FIG. 1; distributed RC networks, as shown in FIG. 2; or some combination of these. In these figures, the circuit is driven at the "near end" by applying the voltage $V_{NEAR\_END}$, where the $V_{FAR\_END}$ is the result level at the "far end" of the network. For modeling, any network can be simplified to a lumped RC model such as in FIG. 1 to see the equivalent time constant for settling. For optimal accuracy and delay, the driver applying $V_{NEAR\_END}$ should be designed with sufficient current capability.

Figure 3:
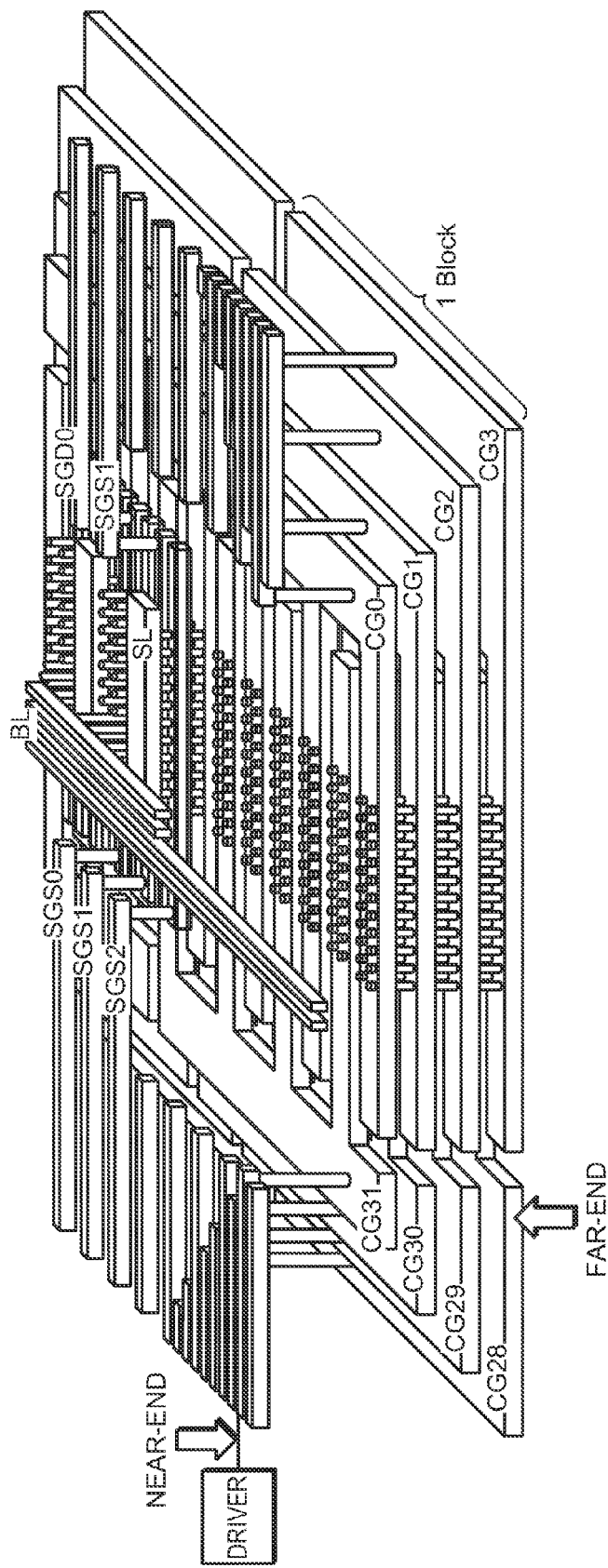
FIG. 3 is a schematic representation of a 3D memory showing how the near and far ends correspond.

To look at a specific example in more detail, FIG. 3 illustrates on-chip signaling for a 3D memory structure, such as is described in more detail in the references cited above. The routing for such 3D memories is a rather complex example of a distributed RC model with a mesh network. The 3D structure introduces large capacitances between main substrate and various wires as these are quite long and are surrounded on all sides by elements with which they can capacitively couple. They also tend to have highly resistive contacts, vias, and wires since, rather than laying down the metal layers near the end of the process, here the formation of the contacts, vias, and wires for one level is followed by the formation of another level on top, so the materials used need to be able to handle this subsequent process processing and, because of this, are typically more resistive. This results in a large effective R and C increase and, consequently, a large RC time constant for settling, larger than would be expected for the routing in a more typical, single layer NAND memory. Waiting for the RC network to settle by its own time constant when the level at the near end changes can consequently limit performance.

Figure 4:
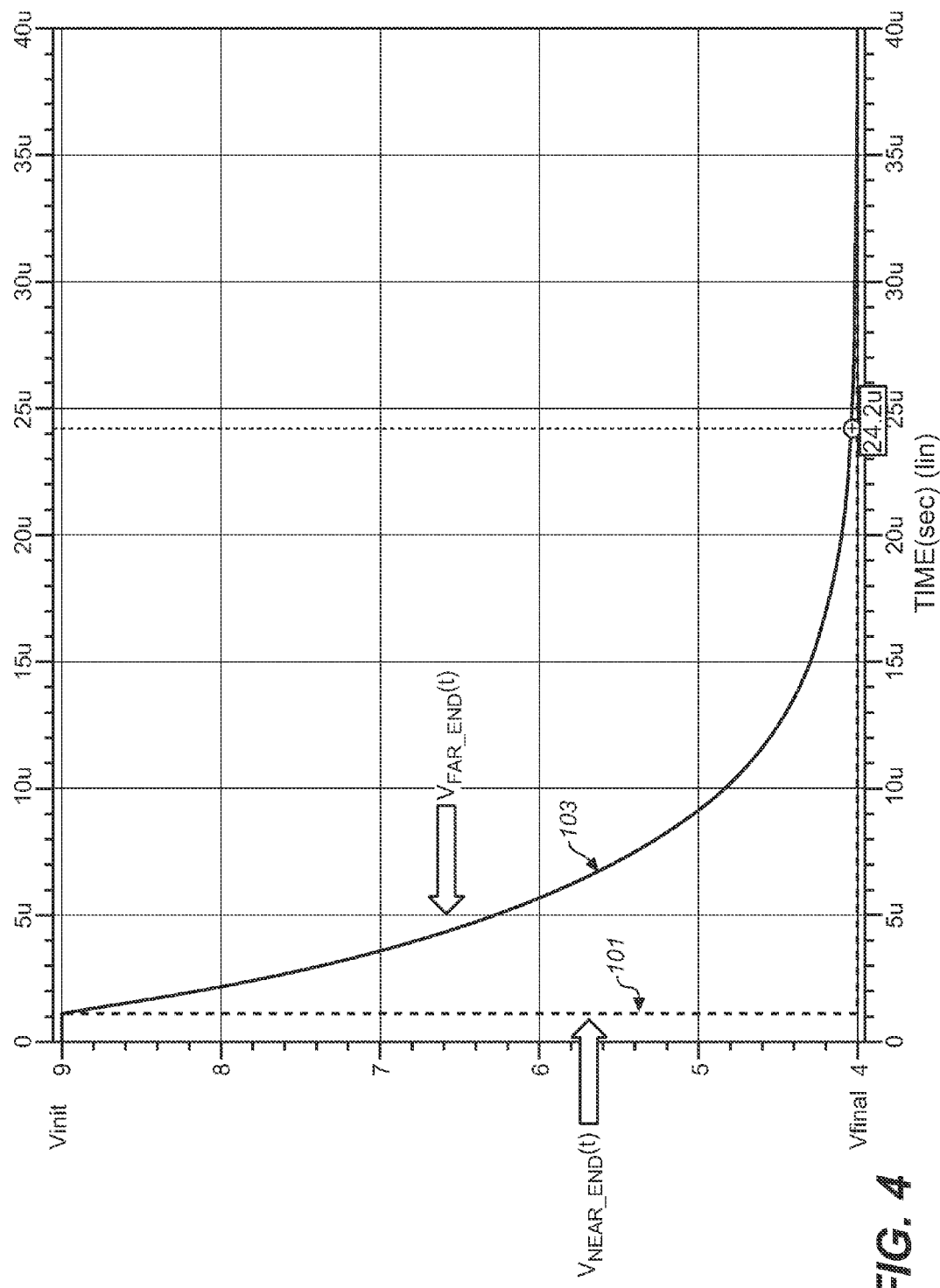
FIG. 4 show the near end and far end response of an exemplary lumped RC model.

Going back to FIG. 1, at the left is shown an example of a step response being applied to the near end, where it is discharged from $V_{HI}$ to $V_{LOW}$. (The discussion here is given primarily in a high to low transition, but a corresponding situation applies to the low to high case.) The voltage accuracy and delay at the far end is limited by the network's time constant, $\tau=R_P.C_P$, with the $V_{FAR\_END}$ only asymptotically approaching $V_{NEAR\_END}$. After a time of $\tau$ the amount of error at the far end is 37% and to reach an error of only 1% takes 4.6 $\tau$. This is illustrated in FIG. 4. The near end voltage $V_{NEAR\_END}$ 101 is initially at a $V_{INIT}$ value of just under 9V and then, at time=1 µs, $V_{NEAR\_END}$ has a step input and drops to the $V_{FINAL}$ of 4V. In this example, $\tau$ is taken to be 5 µs, so that for $V_{FAR\_END}$ 103 to drop down to have only a 1% error takes 24.2 µs-1 µs=23.2 µs. Consequently, the settling time at the far end target is longer than desired and so that performance could not be improved by increasing the speed to reach within, say, 1% of the target value at the far end in a way that is not so limited by the RC time constant.

Figure 5:
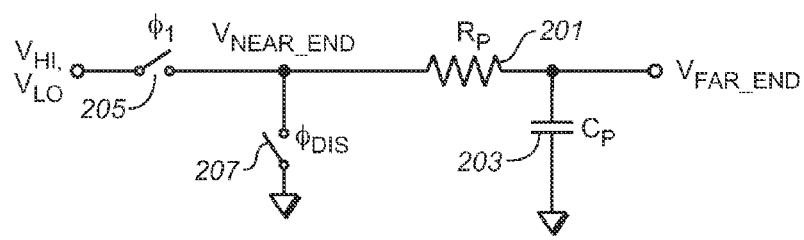
FIG. 5 illustrates the use of an overdrive technique for a lumped RC network.

An overdrive technique can be used to improve the system's performance, as can be illustrate with respect to FIG. 5 for a lumped RC circuit of resistance $R_P$ 201 and capacitance $C_P$ 203 connected between the $V_{NEAR\_END}$ node and the $V_{FAR\_END}$ node. The input voltage ($V_{HI}$ or $V_{LO}$, or, or more generally, other additional values) is now connectable to the $V_{NEAR\_END}$ node by way of a switch $\Phi_1$ 205. The $V_{NEAR\_END}$ node can also be connected to ground by way of the switch $\Phi_{DIS}$ 207. (In this example, the transition is from $V_{HI}$ to $V_{LO}$, where $V_{LO}$ is intermediate to $V_{HI}$ and ground, such as in FIG. 4.) When transitioning from $V_{HI}$ to $V_{LO}$, the near end is discharged from $V_{HI}$ to GND instead of $V_{LO}$, increasing near end voltage change. This causes the far end to reaches the target value much faster than the normal case without overdrive.

The effect of the over-drive can be illustrated with reference to FIG. 6 that compares the far end waveforms for a simple RC circuit and for the RC circuit with overdrive. The simple RC waveform 103 is the same as the far end waveform of FIG. 3. With the over-drive, as shown at 105, reaches $V_{FINAL}$=4V in about 5.44 µs-1 µs=4.44 µs, about 5.23 times (or 18.76 µs) faster. The issue with this arrangement is that, unless stopped, the far end is over-discharged. The over-drive can be stopped (opening switch $\Phi_{DIS}$ 207 and closing switch $\Phi_1$ 205, now at $V_{LO}$) at the appropriate time; however, a fixed discharge time is not optimal due to process (PVT) variations and can result in undershoot or overshoot and excess power consumption.

In this example, the transition is from a high level to a low level, but the discussion can also be extended to a low to high level. In either case, the desired final voltage level is intermediate between the initial level and the over-drive voltage. Thus, in the case of a low to high transition, the over-drive voltage would be higher than the final level, such as from a charge pump or one of the high levels available on the circuit. Similarly, for high to low transitions, the over-drive level can be ground or even a negative voltage, if available on the circuit. Generally speaking, the greater the degree of over-drive, the more quickly the far end level will transition; however, this must be balanced against power consumption concerns and possible damage it too extreme of values are used.

Referring back now to FIG. 6, the question is then how to accurately control the overdrive pulse width. Unlike communication applications, where the signal transitions occur too rapidly, in the circuit level case, feedback based control can be used to improve the accuracy, improving both settling times and power savings. To implement this, a feedback control scheme is used to determine the far end voltage during discharge at the near end. FIG. 7 is a block diagram of an exemplary embodiment.

In FIG. 7, the elements $R_P$ 201 and $C_P$ 203 can be as before, as are switches $\Phi_1$ 205 and $\phi_{DIS}$ 207, which are now part of the transition switching circuitry grouped as block 210. A small $R_{SENSE}$ resistor 209 is added in the overdrive path, allowing the system to sense the far end voltage through the feedback ratio, with the value of $R_{SENSE}$ 209 is chosen to match the characteristics of how the circuitry between the $V_{SENSE}$ and $V_{FAR\_END}$ behaves and $V_{FAR\_END}$ settles. When the voltage level from the driver transitions (in this example) from $V_{HI}$ to $V_{LO}$, the switch $\Phi_1$ 205 is opened, disconnecting the $V_{SENSE}$ node from the driver, and the switch $\Phi_{DIS}$ 207 is closed to discharge $V_{SENSE}$ to the over-drive level through $R_{SENSE}$ 209. For example, this can be done by way of the CON signal from a state machine or other operation control, as this will know when the transition is to be made. The level at the near end, $V_{SENSE}$, is used as a first input to the comparator 213, whose second input is a reference level $V_{REF}$ that is chosen based on the target far end voltage level. The comparator output controls the discharge time, so that when $V_{SENSE}$ crosses over $V_{REF}$, corresponding to the time when far end voltage hit target value, switch $\Phi_{DIS}$ 207 is opened and the switch $\Phi_1$ 205 is closed to connect $V_{SENSE}$, which is $V_{NEAR\_END}$, back to the driver circuitry that is now at $V_{LO}$.

The ratio of $R_{SENSE}$ to the combined resistance of ($R_{SENSE}$+$R_P$) can be chosen to be small, so that the time constant is increased only by small percentage. For example, $R_{SENSE}$ can be taken so that $R_{SENSE}$=0.1.$R_P$, which will have little impact to overall RC settling time, while still allowing the overdrive technique to reduces the delay significantly (~80% in the example). The $V_{REF}$ can then be set equal $(R_{SENSE}/(R_{SENSE}+R_P))V_F=0.363\ V_F$ as the feedback ratio.

Figure 6:
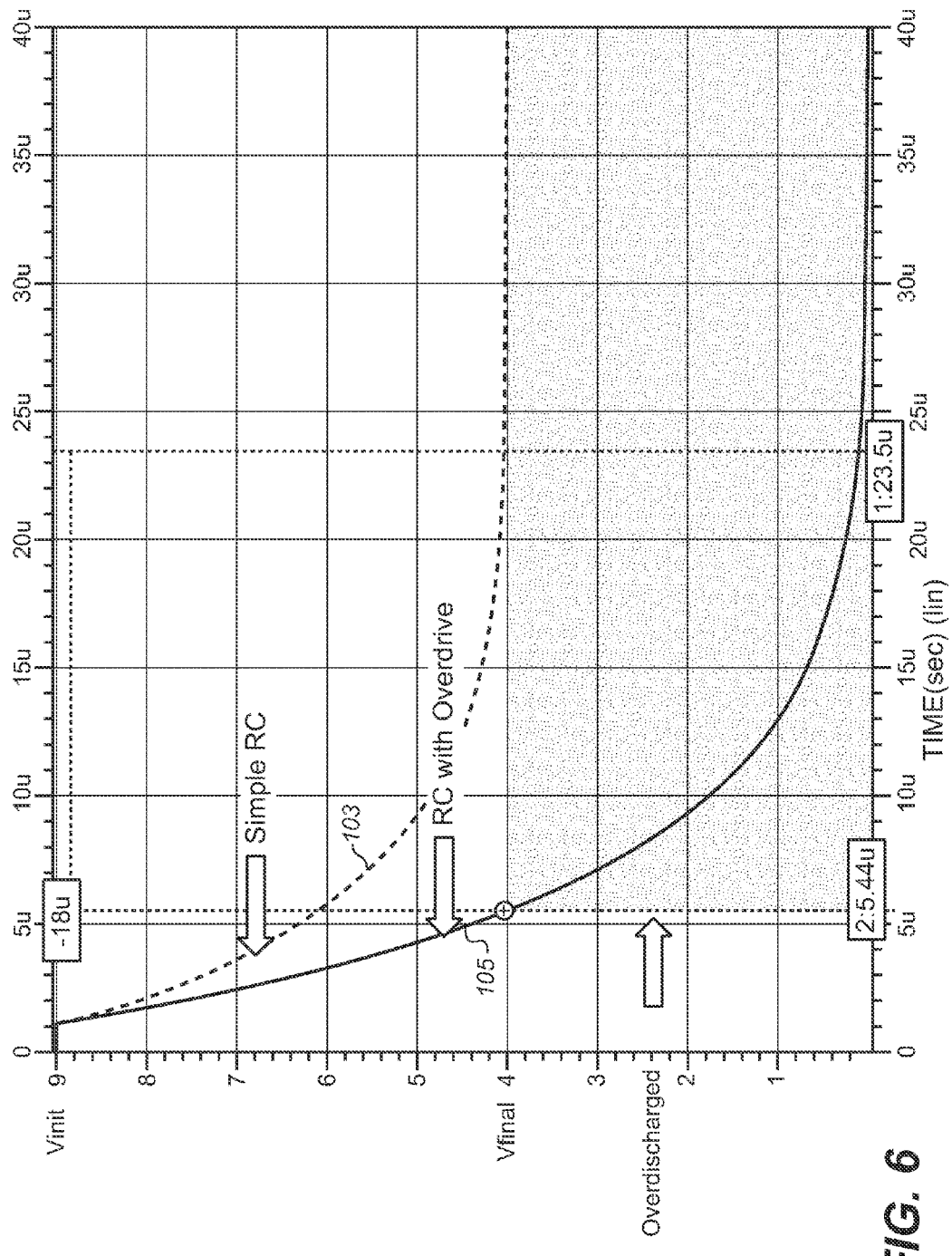
FIG. 6 illustrates the effect of an overdrive technique for the far end response of an exemplary lumped RC model.
Figure 7:
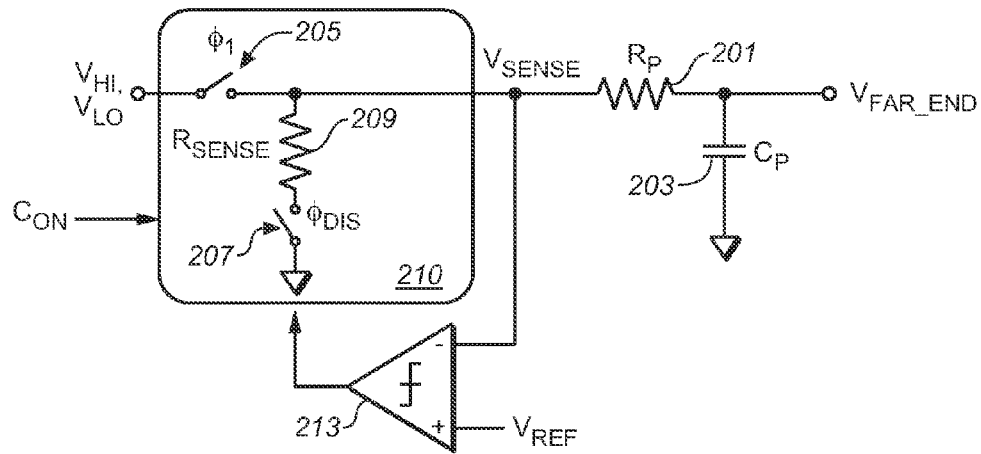
FIG. 7 shows aspects of an exemplary embodiment of a feedback control scheme for use of overdrive.
Figure 8:
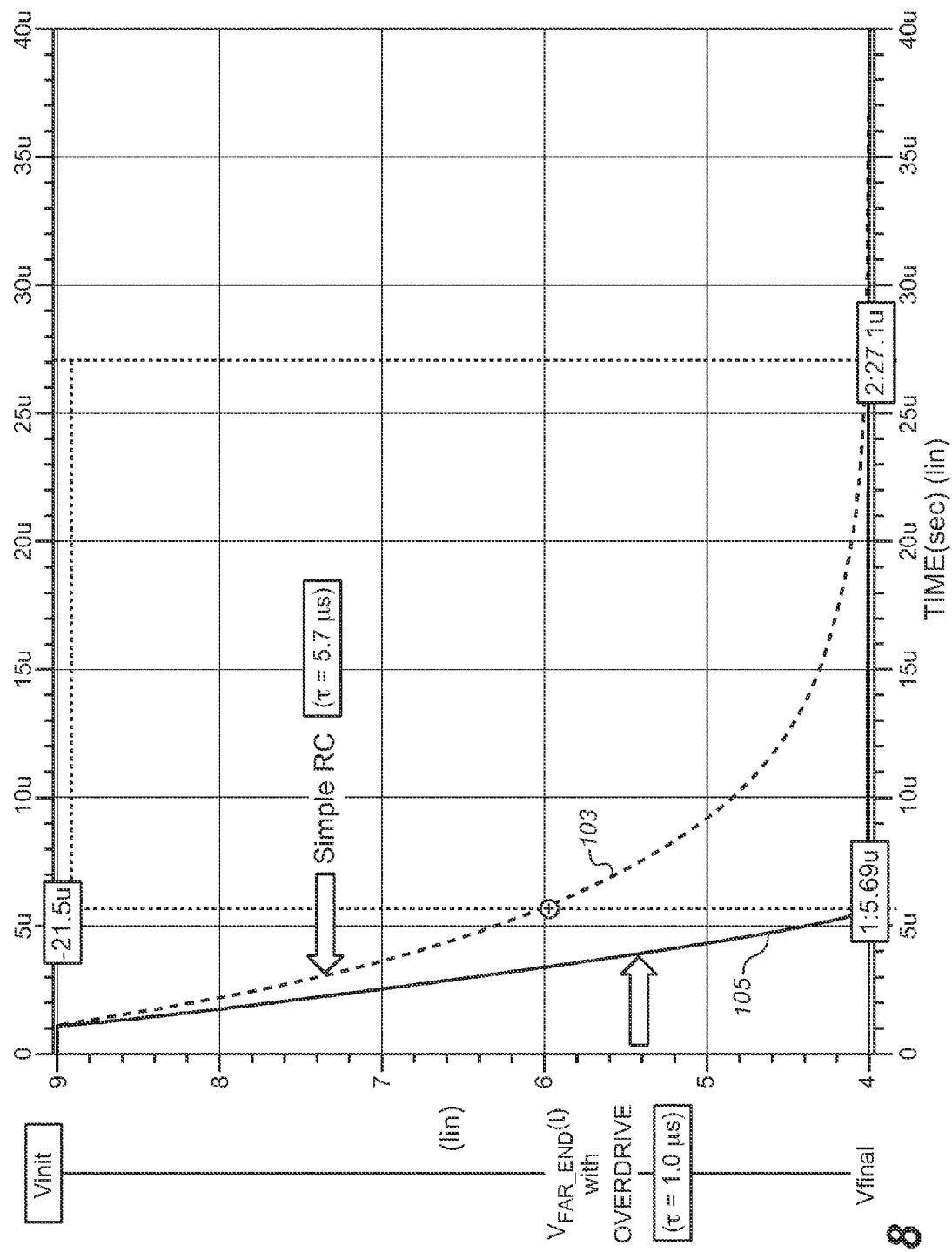
FIG. 8 illustrates the use of an overdrive technique for a lumped RC network with feedback.

FIG. 8 corresponds to FIG. 6, but now using the feedback technique. The far-end level without overdrive is again shown at 103 and the result with overdrive is shown at 105', but which is accelerated as at 105 of FIG. 6, but now cut off by the feedback mechanism at $V_{FINAL}$. This improves τ by about 5.7 times, or from τ=5.7 μs to equivalent τ=1.0 μs in the example. Although FIG. 8 looks at a lumped, single stage model, this technique can also be applied at multi-stage RC networks.

Figure 9A:
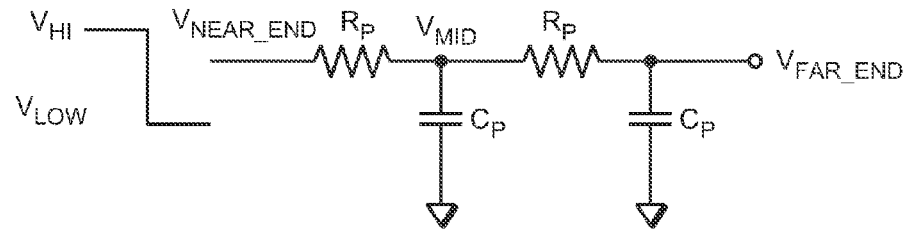
FIGS. 9A and 9B show a two stage RC network with an input waveform and with the switches for implementing the overdrive.
Figure 9B:
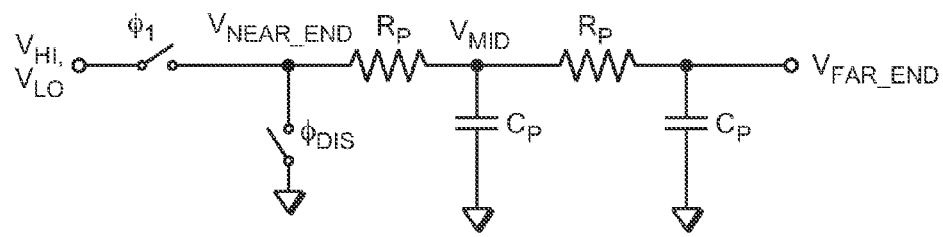

FIGS. 9A and 9B illustrate a two-stage RC network model, where FIG. 9A illustrates the voltage levels ($V_{HI}$, $V_{LO}$) from the driver applied at the near end and FIG. 9B shows the switches for implementing the overdrive, similarly to FIG. 7. (The feedback elements are not shown for this discussion to illustrate intermediate node behavior, but can also be implemented as in FIG. 7.) In addition to the near end $V_{SENSE}$ and far end $V_{FAR\_END}$ levels, FIG. 10 also looks that behavior of the intermediate node having level $V_{MID}$, again for a high (~9V) to low (~4V) transition using an overdrive level of ground.

Figure 10:
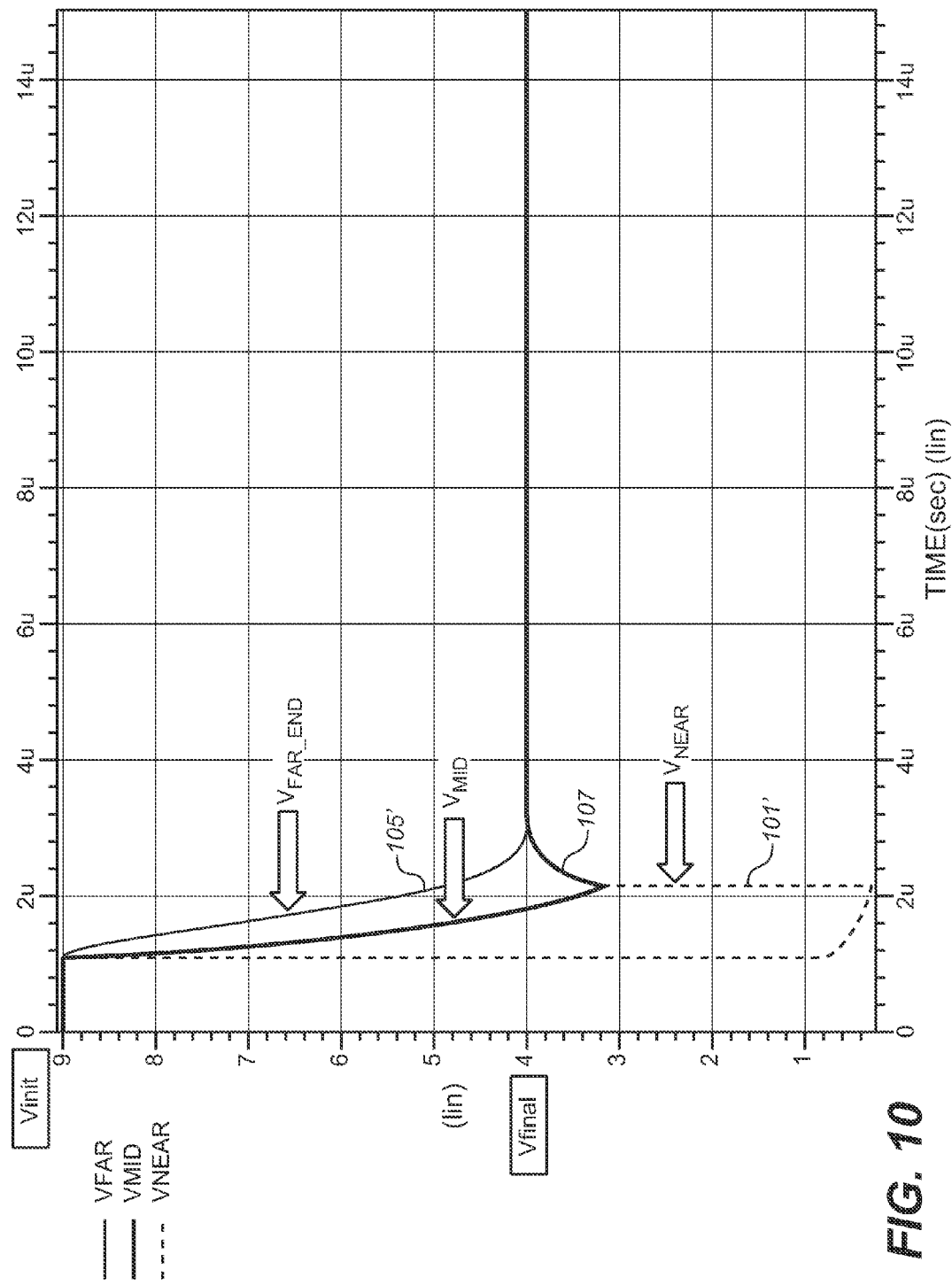
FIG. 10 illustrates the use of an overdrive technique with feedback for a two stage RC network.

In FIG. 10 $V_{FAR\_END}$ 105' again is quickly pulled down toward $V_{FINAL}$ by the overdrive level of ground until just after 2 μs, when the driver (now at the $V_{FINAL}$ value of $V_{LO}$) is reconnected. The $V_{SENSE}$ level, shown at 101', quickly goes towards ground upon the connection of the overdrive level, after which it is rises back up toward $V_{FINAL}$. The intermediate node $V_{MID}$, shown at 107, is pulled down more quickly than $V_{FAR\_END}$ and may be lower than the $V_{FINAL}$ level, but then also rises up to $V_{FINAL}$ when the near side is connected to $V_{LO}$. Although $V_{SENSE}$ node is connected to $V_{LO}$ when $V_{FAR\_END}$ is still a ways above the desired $V_{FINAL}$ level, both $V_{SENSE}$ and $V_{MID}$ are still below $V_{LO}$ at this time and continue to provide an overdrive effect and charge equalization between capacitances as the system settles. This residual overdrive as the system settles allows power savings. More complicated systems exhibit similar behavior, but with a greater number of intermediate nodes. Although the exemplary embodiment only applies the overdrive at the far end, additional overdrive could be applied at intermediate nodes if desired, but this adds complexity and is often not easily implemented.

For many applications, the first order accuracy achieved in design phase will be accurate enough within tolerances of the existing RC delay network; however, to further improve the accuracy of this scheme on silicon, the values of $R_{SENSE}$, $V_{REF}$, or both can be made trimmable. For example, $R_{SENSE}$ can be varied based on observing the comparator output and $V_{REF}$ can be tuned independently to achieve an even more accurate detection point. This has the advantage of being able to set the detection point accurately and achieve even more accurately the far end performance and also to track process (PVT) variations.

The techniques described above allow any RC network to significantly improve the RC delay performance of the network with high accuracy and power savings. The optional trimming capability allows for any complex RC network to be modeled as a single pole RC network and the trimming can be performed to set the target reference voltage to achieve a minimal RC delay, mimicking the lumped RC model.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A circuit to supply voltage levels to a load circuit, comprising:
    driver circuitry connectable to supply at least a first voltage level and a second voltage level to the load circuit;
    a first switch through which the driver circuitry is connectable to the load circuit;
    a second switch connected between a third voltage level and a first node between the first switch and the load circuit, wherein the second voltage level is intermediate to the first and third voltage levels;
    a resistance, where the resistance is connected in series with the second switch between the third voltage level and the first node; and
    control circuitry connectable to control the first and second switches, including a feedback circuit having a comparator having a first input connected to a second node between the first switch and the load circuit and a second input connected a reference voltage level, wherein when the driver circuitry changes from supplying the first level to the second level, the control circuitry initially opens the first switch and closes the second switch and, based on the output of the comparator, subsequently closes the first switch and opens the second switch.

2. The circuit of claim 1, wherein the first voltage is higher than the second voltage.

3. The circuit of claim 2, wherein the third voltage is ground.

4. The circuit of claim 1, wherein the first voltage is lower than the second voltage.

5. The circuit of claim 1, wherein the circuit is a peripheral element on a memory circuit and the load circuit is a part of a memory array on the memory circuit.

6. The circuit of claim 5, wherein the load circuit is one or more bit lines of the memory array.

7. The circuit of claim 5, wherein the load circuit is one or more word lines of the memory array.

8. The circuit of claim 5, wherein the memory array is of a 3D-type of architecture.

9. The circuit of claim 5, wherein the memory array is of a NAND-type of architecture.

10. The circuit of claim 1, wherein the value of the reference voltage level is trimmable.

11. The circuit of claim 1, wherein the value of the resistance is trimmable.

12. The circuit of claim 1, wherein the value of the reference voltage level is based on characteristics of the load circuit.

13. The circuit of claim 1, wherein the value of the resistance is based on characteristics of the load circuit.

14. A method of supplying a load, comprising:
    supplying the load at an input node at a first voltage from a driver circuit;
    subsequently supplying the load at the input node at a second voltage level from the driver circuit; and
    subsequent to supplying the load at the first voltage and prior to supplying the load at the second voltage, performing a transition process including:
        disconnecting the input node from the driver circuit and connecting the input node to a third voltage level through a first resistance, wherein the second voltage level is intermediate to the first and third voltage level;

with the input node disconnected from the driver circuit and connected to the third voltage level through the first resistance, monitoring the voltage level on the input node; and in response to determining the voltage level on the input node reaching a reference value, disconnecting the input node from the third voltage level and connecting the input node to the driver circuit to be supplied at the second voltage.

15. The method of claim 14, wherein monitoring the voltage level on the input node comprises receiving the level at the input node at a first input of a comparator and receiving a reference voltage at a second input of the comparator, and wherein determining the voltage level on the input node reaching the reference value is based on the output of the comparator.

16. The method of claim 14, wherein the first voltage is higher than the second voltage.

17. The method of claim 16, wherein the third voltage is ground.

18. The method of claim 14, wherein the first voltage is lower than the second voltage.

19. The method of claim 14, wherein the load is a part of a memory array on the memory circuit.

20. The method of claim 19, wherein the load is one or more bit lines of the memory array.

21. The method of claim 19, wherein the load is one or more word lines of the memory array.

22. The method of claim 19, wherein the memory array is of a 3D-type of architecture.

23. The method of claim 19, wherein the memory array is of a NAND-type of architecture.

24. The method of claim 14, wherein the value of the reference value is trimmable.

25. The method of claim 14, wherein the value of the first resistance is trimmable.

26. The method of claim 14, wherein the value of the reference value is based on characteristics of the load circuit.

27. The method of claim 14, wherein the value of the first resistance is based on characteristics of the load circuit.

* * * * *